(12) United States Patent
Jeon

(10) Patent No.: US 9,236,129 B2
(45) Date of Patent: Jan. 12, 2016

(54) FLASH MEMORY INTEGRATED CIRCUIT WITH COMPRESSION/DECOMPRESSION CODEC

(75) Inventor: Jun Young Jeon, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 965 days.

(21) Appl. No.: 12/458,641

(22) Filed: Jul. 17, 2009

(65) Prior Publication Data

US 2010/0077133 A1    Mar. 25, 2010

(30) Foreign Application Priority Data

Sep. 11, 2008  (KR) .................. 10-2008-0089925

(51) Int. Cl.
| | | |
|---|---|---|
| G06F 17/00 | (2006.01) | |
| G06F 12/00 | (2006.01) | |
| G06F 12/02 | (2006.01) | |
| G11C 16/10 | (2006.01) | |
| G11C 16/26 | (2006.01) | |

(52) U.S. Cl.
CPC ................ *G11C 16/10* (2013.01); *G11C 16/26* (2013.01)

(58) Field of Classification Search
None
See application file for complete search history.

(56) References Cited

U.S. PATENT DOCUMENTS

| | | | | | |
|---|---|---|---|---|---|
| 5,432,891 A | * | 7/1995 | Onodera | ................ | G06K 15/00 358/1.15 |
| 6,081,783 A | * | 6/2000 | Divine | .................... | H03M 7/30 704/201 |
| 2002/0122343 A1 | * | 9/2002 | Koshikawa | ............ | G11C 29/72 365/200 |
| 2002/0151992 A1 | * | 10/2002 | Hoffberg | ........... | G05B 19/0426 700/83 |
| 2006/0221737 A1 | * | 10/2006 | Santin | ..................... | G11C 29/40 365/201 |
| 2007/0065018 A1 | * | 3/2007 | Thiagarajan | ........... | H04N 19/50 382/232 |
| 2008/0055121 A1 | * | 3/2008 | Fulcomer | ................ | H03M 7/40 341/51 |
| 2009/0244949 A1 | * | 10/2009 | Ravasio | ................ | G06F 13/385 365/63 |
| 2010/0011150 A1 | * | 1/2010 | Klein | .................. | G06K 12/0246 711/103 |
| 2010/0027625 A1 | * | 2/2010 | Wik | ....................... | G10L 19/002 375/240.12 |
| 2010/0077133 A1 | * | 3/2010 | Jeon | ........................ | G11C 16/26 711/103 |

FOREIGN PATENT DOCUMENTS

KR    10-2008-0023191    3/2008

OTHER PUBLICATIONS

Korean Office Action dated Jul. 28, 2014 from Korean Patent Application 10-2008-0089925, 7 pages.

* cited by examiner

*Primary Examiner* — Shyue Jiunn Hwa
(74) *Attorney, Agent, or Firm* — Harness, Dickey & Pierce, P.L.C.

(57) ABSTRACT

Provided is a flash memory integrated circuit with a compression codec. The flash memory integrated circuit may simultaneously include a memory block and a compression codec circuit. The compression codec circuit may compress input data. A controller circuit may store the compressed input data in at least one page that is included in the memory block. Through this, it is possible to enhance a usage efficiency of a flash memory.

9 Claims, 6 Drawing Sheets

FLASH MEMORY INTEGRATED CIRCUIT WITH COMPRESSION/DECOMPRESSION CODEC

CROSS-REFERENCE TO RELATED APPLICATIONS

This application claims the benefit of Korean Patent Application No. 10-2008-0089925, filed on Sep. 11, 2008, in the Korean Intellectual Property Office, the disclosure of which is incorporated herein by reference.

BACKGROUND

1. Field

One or more embodiments relate to a write operation or a read operation of a flash memory, and more particularly, to a technology associated with compressing input data of the flash memory and storing the compressed data.

2. Description of the Related Art

A flash memory may be a non-volatile memory that maintains stored data even when a power is not supplied. The flash memory may include a plurality of memory blocks. The flash memory may provide a function that can electrically erase and re-write data stored in the memory blocks.

Each of the memory blocks includes a plurality of cells. Here, the flash memory may have various types of cells such as NAND and NOR according to a physical structure of the cells. In particular, since a NAND flash memory may store a large capacity of data and may adopt a high density, there is great interest regarding NAND flash memory. Currently, the NAND flash memory is being widely used as a storage medium, and the like, for a portable device, for example, a mobile phone, a digital camera, an MP3 player, a camcorder, a personal digital assistant (PDA), and the like.

Each of the cells may be constructed to have a transistor. In a general flash memory, a threshold voltage of the transistor may be adjusted to program data or to read the data. In this instance, the cells may be classified into a single level cell (SLC) or a multi-level cell (MLC) according to a number of threshold voltages of the transistor.

The flash memory may need to be well designed in a situation where an area and a cost are limited. In particular, additional devices may be provided in the flash memory in order to reduce the size of data stored in the flash memory.

SUMMARY

According to an aspect of one or more embodiments, there may be provided a flash memory integrated circuit with a compression codec, including at least one memory block to include a plurality of pages, a compression codec circuit to compress input data, and a controller circuit to generate a control signal in order to sequentially write the compressed input data in at least one page among the plurality of pages.

The flash memory integrated circuit may further include a type decision circuit to determine whether the input data is compressed data. The compression codec circuit may compress the input data when the input data is not the compressed data.

According to another aspect of one or more embodiments, there may be provided a flash memory integrated circuit with a compression codec, including at least one memory block to include a plurality of pages, a controller circuit to generate a control signal in order to read compressed data that is written in at least one page among the plurality of pages, and a compression codec circuit to decompress the read compressed data according to a predetermined algorithm.

According to still another aspect of one or more embodiments, there may be provided a method of operating a flash memory with a compression codec, the method including compressing input data of the flash memory according to a predetermined compression algorithm, and generating a control signal in order to write the compressed input data in at least one page among a plurality of pages that is included in at least one memory block of the flash memory.

According to yet another aspect of one or more embodiments, there may be provided a method of operating a flash memory with a compression codec, the method including generating a control signal in order to read compressed data that is written in at least one page among a plurality of pages included in at least one memory block of the flash memory, and decompressing, by a compression codec circuit, the read compressed data according to a predetermined algorithm.

An aspect of one or more embodiments may provide a flash memory integrated circuit with a compression codec that may compress input data of a flash memory and thereby reduce the size of data stored in the flash memory and enhance a usage efficiency of the flash memory, and a method of operating the flash memory.

Another aspect of one or more embodiments may also provide a flash memory integrated circuit with a compression codec that may additionally write, in a flash memory, identification information capable of identifying compressed input data and thereby effectively read and decompress the compressed input data, and a method of operating the flash memory.

Another aspect of one or more embodiments may also provide a flash memory integrated circuit with a compression codec that may compress input data according to a type of the input data and thereby enhance a usage efficiency of a flash memory, and a method of operating the flash memory.

Additional aspects, features, and/or advantages of embodiments will be set forth in part in the description which follows and, in part, will be apparent from the description, or may be learned by practice of the disclosure.

BRIEF DESCRIPTION OF THE DRAWINGS

These and/or other aspects and advantages will become apparent and more readily appreciated from the following description of the embodiments, taken in conjunction with the accompanying drawings of which.

DETAILED DESCRIPTION OF EMBODIMENTS

Figure 1:
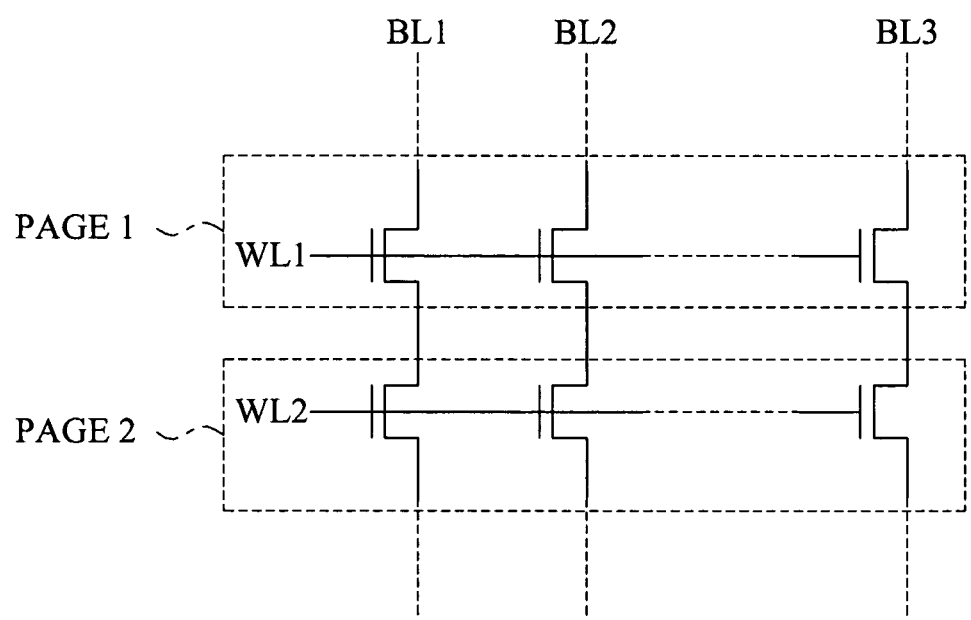
FIG. 1 illustrates a structure of a plurality of pages included in a single memory block according to an embodiment.

Reference will now be made in detail to the embodiments, examples of which are illustrated in the accompanying drawings, wherein like reference numerals refer to the like elements throughout. The embodiments are described below to explain the present disclosure by referring to the figures.

FIG. 1 illustrates a structure of a plurality of pages included in a single memory block according to an embodiment.

Referring to FIG. 1, the single memory block may include the plurality of pages such as a page 1 and a page 2. Each of the pages may include a plurality of memory cells.

Gates of the memory cells may be connected to word lines WL1 and WL2, respectively. Sources of the memory cells may be connected to bit lines BL1, BL2, and BL3, respectively.

When writing data in the memory block, a controller circuit may generate a control signal corresponding to the data. The generated control signal may appropriately control voltages or currents to be applied to the word lines WL1 and WL2, and the bit lines BL1, BL2, and BL3. In particular, since a write operation is generally performed based on a page unit, voltages or currents corresponding to the control signal may be sequentially applied to the word lines WL1 and WL2. In this instance, a threshold voltage of a transistor of each of the memory cells may change according to the applied voltage or current. The data may be expressed by the changed threshold voltage of the transistor.

Also, when reading the data stored in the memory block, the controller circuit may generate a control signal to detect a current threshold voltage of the transistor. The data stored in the memory block may be detected according to the detected threshold voltage.

Figure 2:
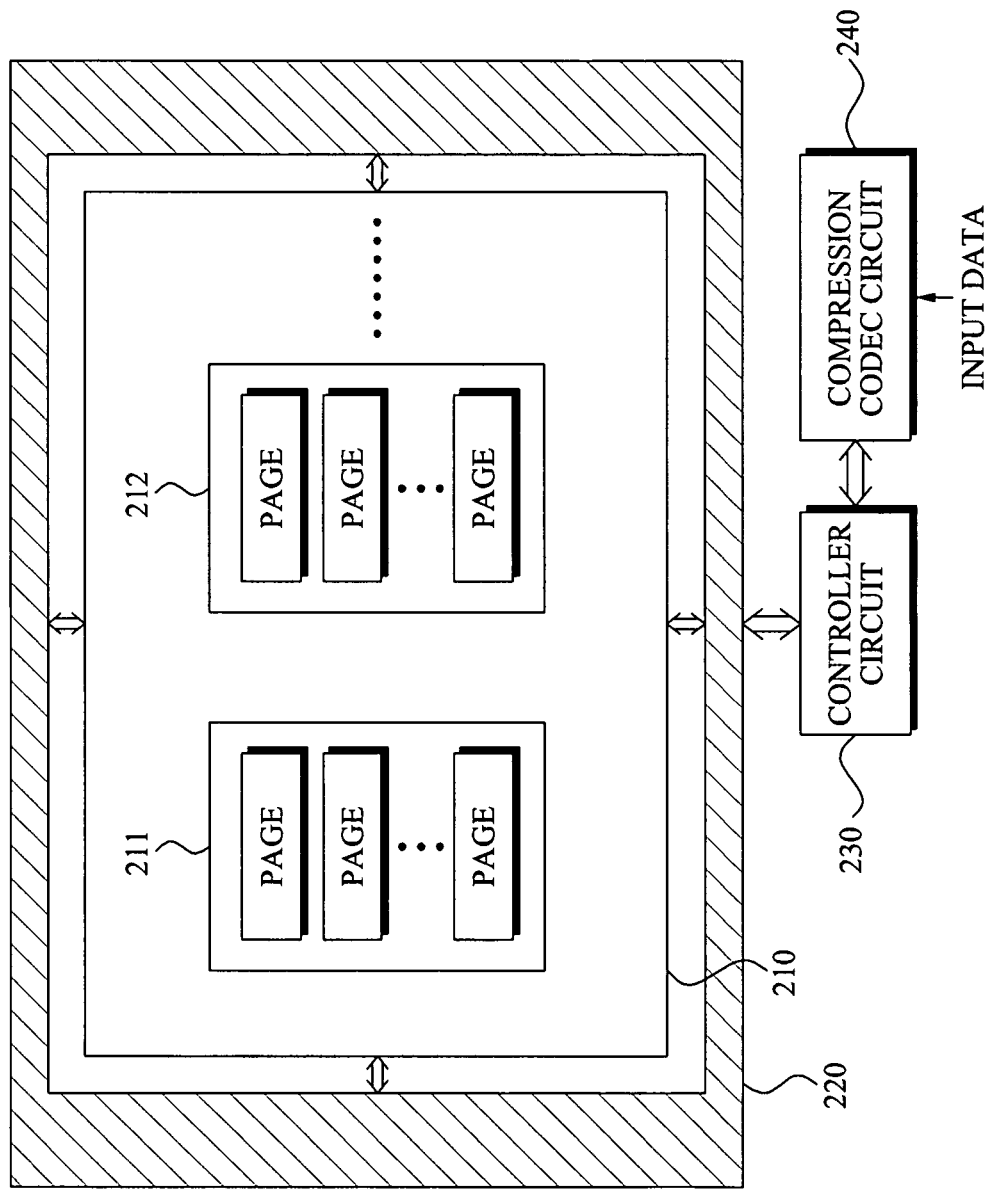
FIG. 2 illustrates a flash memory integrated circuit with a compression codec according to an embodiment.

FIG. 2 illustrates a flash memory integrated circuit with a compression codec according to an embodiment.

Referring to FIG. 2, a memory array 210 may be connected to a controller circuit 230 and a compression codec circuit 240 via an interface circuit 220. Here, the interface circuit 220 may transfer, to the memory array 210, a control signal that is generated by the controller circuit 230.

The memory array 210 may include a plurality of memory blocks 211 and 212. Each of the memory blocks 211 and 212 may include a plurality of pages. Also, although not shown in FIG. 2, each of the pages may include a plurality of memory cells. The plurality of memory cells may be configured into various types of electrical devices. For example, each of the memory cells may be configured into a single transistor.

In a general flash memory, an erase operation may be performed based on a block unit. A read operation and a write operation may be performed based on a page unit. Specifically, when the erase operation is performed, data stored in the plurality of pages that are included in a single block may be sequentially erased. When the read operation and the write operation is performed, the data may be sequentially detected from the plurality of pages, or may be sequentially written in the plurality of pages.

Each of the memory cells may be connected to the controller circuit 230 via the interface circuit 220. The controller circuit 230 may generate a control signal to control a voltage or current to be applied to the memory cells.

Also, the compression codec circuit 240 may compress input data according to a predetermined compression algorithm. Therefore, the input data may be compressed at a compression rate corresponding to the compression algorithm via the compression codec circuit 240, thereby reducing the size of data stored in each of the memory blocks 211 and 212.

In this instance, the compression algorithm may include various types of algorithms, for example, an entropy coding algorithm such as a Huffman compression algorithm and an arithmetic compression algorithm, a pre-coding algorithm, a combination of the entropy coding algorithm and the pre-coding algorithm, and the like.

Since the compression codec circuit 240 existing in the flash memory integrated circuit unconditionally or selectively compresses input data, it is possible to reduce the size of data stored in each of the memory blocks 211 and 212.

Specifically, the compression codec circuit 240 may unconditionally compress the input data regardless of whether the input data is compressed data. When the input data is compressed, a compression efficiency is not great and thus the compression codec circuit 240 does not compress the input data.

The compression codec circuit 240 may exist in the flash memory integrated circuit, and may also compress the input data. Accordingly, it is possible to enhance a usage efficiency of the memory blocks 211 and 212.

As described above, when the input data is the compressed data, the compression efficiency of the input data is not great. In this instance, the compression codec circuit 240 compresses the input data depending on whether the input data is the compressed data. Specifically, when the input data is non-compressed data, the compression codec circuit 240 compresses the input data. Conversely, when the input data is the compressed data, the compression codec circuit 240 does not compress the input data.

In order to selectively compress input data, the compression codec circuit 240 may determine a type of input that is received from an outside. Here, the input data may be multimedia data such as video data or audio data. In this instance, the compression codec circuit 240 may compare the type of the input data with predetermined types, for example, MP3 (MPEG Audio Layer-3), MP4, and MPEG to thereby determine whether the input data is compressed data or non-compressed data.

For example, when the input data is compressed multimedia data as audio data such as MP3 and MP4, or video data such as MPEG, the compression codec circuit 240 may compress the input data. When the input data is non-compressed multimedia data, the compression codec circuit 240 may not compress the input data.

The compression codec circuit 240 may compress the input data according to a predetermined compression algorithm to generate various types of compressed input data. For example, the compression codec circuit 240 may compress the input data, audio data, to generate the compressed data such as MP3 and MP4.

Also, when compressing the input data, the compression codec circuit 240 may additionally generate identification information corresponding to the compressed input data, to make it possible to identify the compressed input data.

For example, when reading the compressed input data that is written in a memory block of a flash memory, it is possible to identify the identification information and thereby verify that the read data is compressed by the compression codec circuit 240.

Also, the controller circuit 230 may provide the interface circuit 220 with a control signal to write, in the memory array 210, the input data or the compressed input data that is provided from the compression codec circuit 240. In this instance, the input data or the compressed input data may be written in the memory array 210 by adjusting an electrical stimulus to be applied to the memory cells according to the control signal.

According to an embodiment, the memory array 210, the controller circuit 230, and the compression codec circuit 240 may be configured into a single chip, for example, a System-on-Chip (SoC) form.

Figure 3:
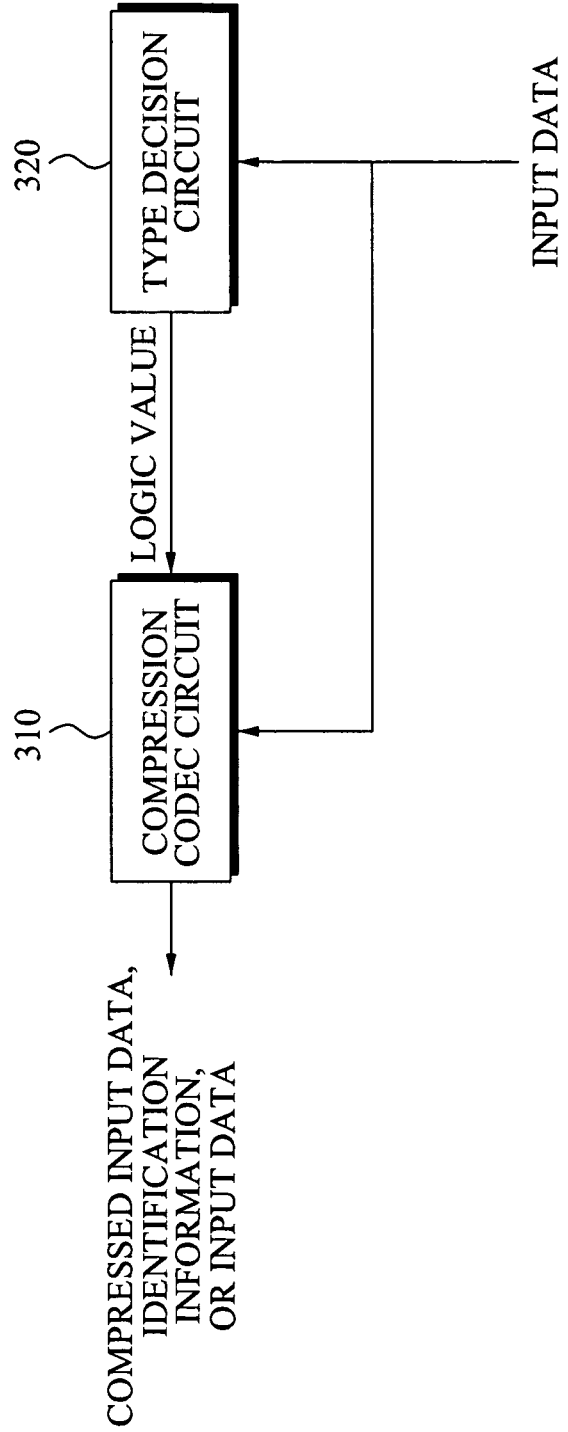
FIG. 3 illustrates a block diagram of an example of a compression codec circuit and a type decision circuit according to an embodiment.

FIG. 3 illustrates a block diagram of an example of a compression codec circuit 310 and a type decision circuit 320 according to an embodiment.

Referring to FIG. 3, a flash memory integrated circuit with a compression codec according to an embodiment may further include the compression codec circuit 310 and the type decision circuit 320.

The type decision circuit 320 may determine whether input data is compressed data. In this instance, the type decision circuit 320 may compare a type of the input data with predetermined types to determine whether the input data is compressed data or non-compressed data. For example, the type decision circuit 320 may determine whether the input data is MP3 data, MP4 data, or MPEG data.

When the input data is the compressed data, the type decision circuit 320 may provide a first logic value. Conversely, when the input data is the non-compressed data, the type decision unit 320 may provide a second logic value.

Also, the compression codec circuit 310 may verify whether the input data is the compressed data or the non-compressed data based on one of at least two possible logic values provided from the type decision circuit 320. When the provided logic value is a second logic value, the compression codec circuit 310 may compress the input data to generate the compressed input data. In this instance, the compression codec circuit 310 may additionally generate identification information indicating that the input data is the compressed input data.

Conversely, when the provided logic value is a first logic value, the input data is already compressed and thus the compression codec circuit 310 may provide the input data to a controller circuit (not shown) as is.

When the original input data is received from the compression codec circuit 310, the controller circuit may generate a control signal to write the input data in a flash memory. When the compressed input data and identification information corresponding thereto are received from the compression codec circuit 310, the controller circuit may generate a control signal to write, in the flash memory, the compressed input data and the identification information corresponding thereto.

Figure 4:
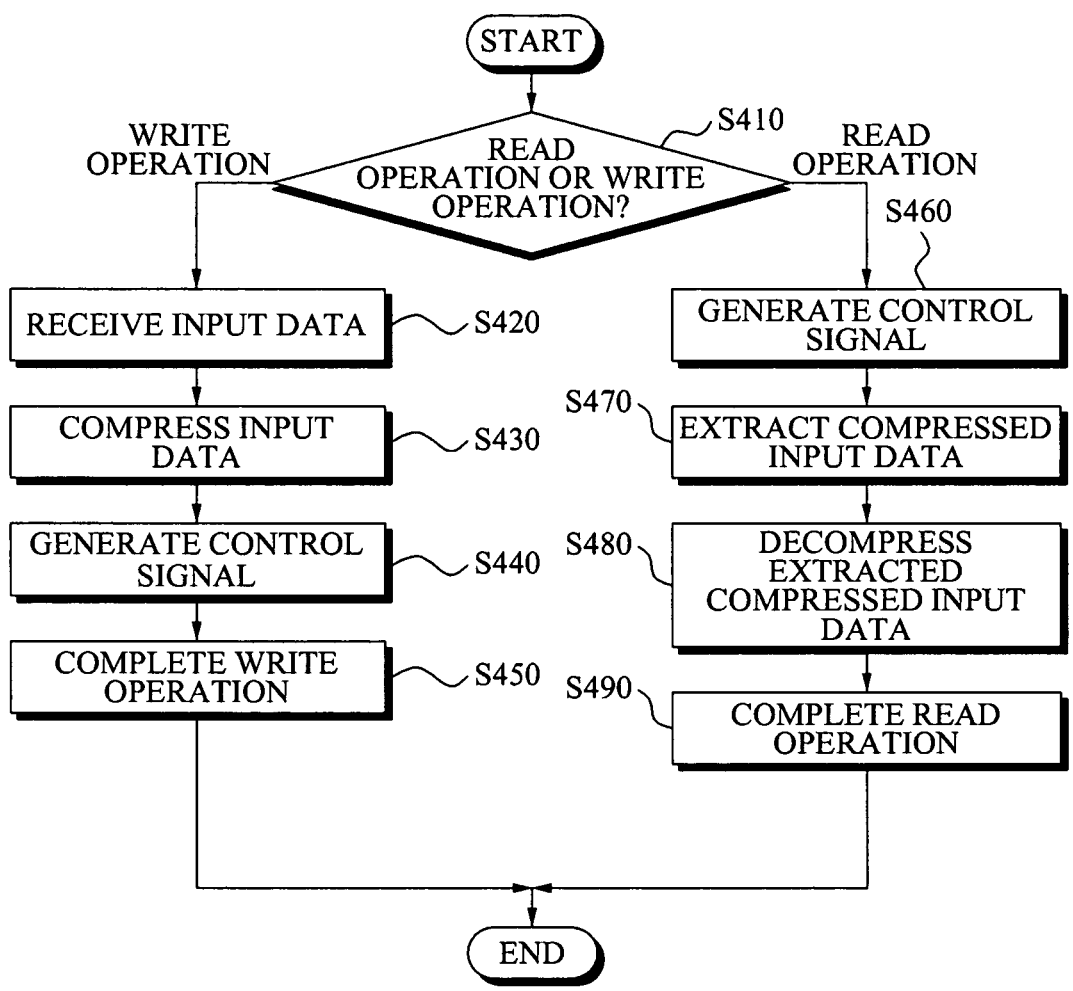
FIG. 4 illustrates a flowchart of a method of operating a flash memory with a compression codec according to an embodiment.

FIG. 4 illustrates a flowchart of a method of operating a flash memory with a compression codec according to an embodiment.

Referring to FIG. 4, in operation S410, the flash memory may determine whether a request for a read operation or a write operation is received.

When the request for the write operation is received, the flash memory may receive input data in operation S420. In operation S430, the flash memory may compress the input data according to a predetermined algorithm to generate the input data that is compressed at a predetermined compression rate. In response to the compressed input data, the flash memory may generate a control signal to control a voltage or current of word lines or bit lines that are included in a memory block, in operation S440. In operation S450, a threshold voltage of memory cells included in the memory block may change according to the control signal, and the compressed input data may be written in the memory block including the memory cells.

Also, when the request for the read operation is received, the flash memory may generate a control signal to detect a voltage of the memory cells in operation S460. Here, it is assumed that compressed input data is stored in the memory block. In operation S470, the flash memory may detect a threshold voltage of the memory cells to thereby extract the compressed input data stored in the memory block. In operation S480, the flash memory may decompress the extracted compressed input data. In operation S490, the read operation may be completed.

Figure 5:
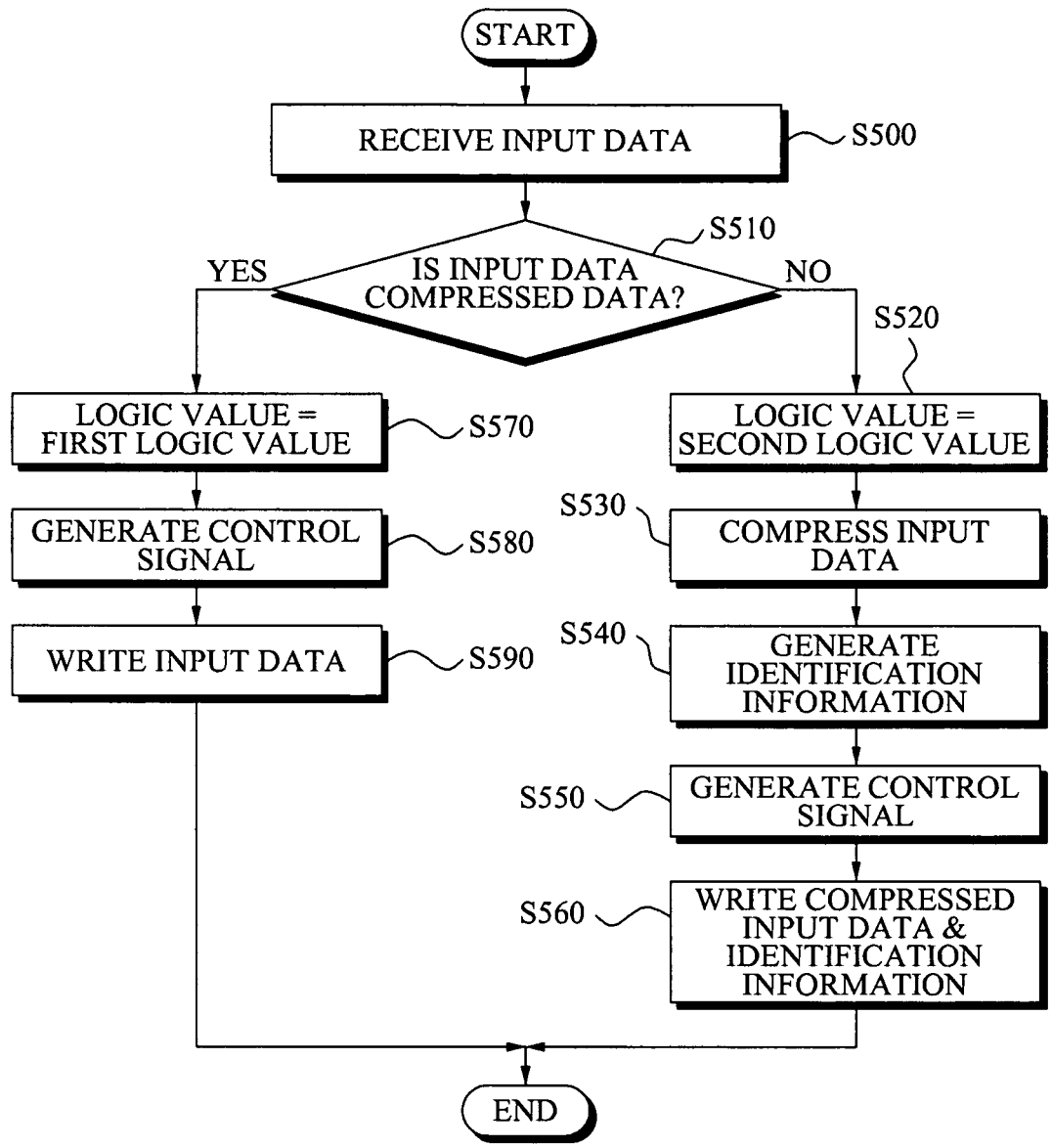
FIG. 5 illustrates a flowchart of a method of operating a flash memory with a compression codec to perform a write operation according to an embodiment.

FIG. 5 illustrates a flowchart of a method of operating a flash memory with a compression codec to perform a write operation according to an embodiment.

Referring to FIG. 5, the operating method of the flash memory may receive input data that is provided from an outside device, in operation S500. For example, the input data may be multimedia data.

In operation S510, the operating method of the flash memory may determine whether the input data is compressed data or non-compressed data in order to selectively compress the input data. According to an embodiment, the operating method of the flash memory may compare a type of input data with predetermined types to thereby determine whether the input data is the compressed data or the non-compressed data.

When the input data is the compressed data, the operating method of the flash memory may determine a logic value corresponding to the input data as a first logic value in operation S570. The input data and the logic value of the input data may be provided to a controller circuit.

In operation S580, the controller circuit may generate a control signal corresponding to the input data, so that the input data may be written in the flash memory. In response to the control signal, the input data may be written in the flash memory as is in operation S590.

Conversely, when the input data is the non-compressed data, the operating method of the flash memory may determine the logic value corresponding to the input data as a second logic value in operation S520.

In operation S530, the operating method of the flash memory may compress the input data in response to the second logic value. Specifically, according to an embodiment, the operating method of the flash memory may compress input data according to a logic value corresponding to the input data.

In operation S540, the operating method of the flash memory may additionally generate identification information corresponding to the compressed input data.

In operation S550, the controller circuit may generate a control signal corresponding to the identification information and the compressed input data. In operation S560, the identification information and the compressed input data may be written in a memory block of the flash memory according to the control signal.

Figure 6:
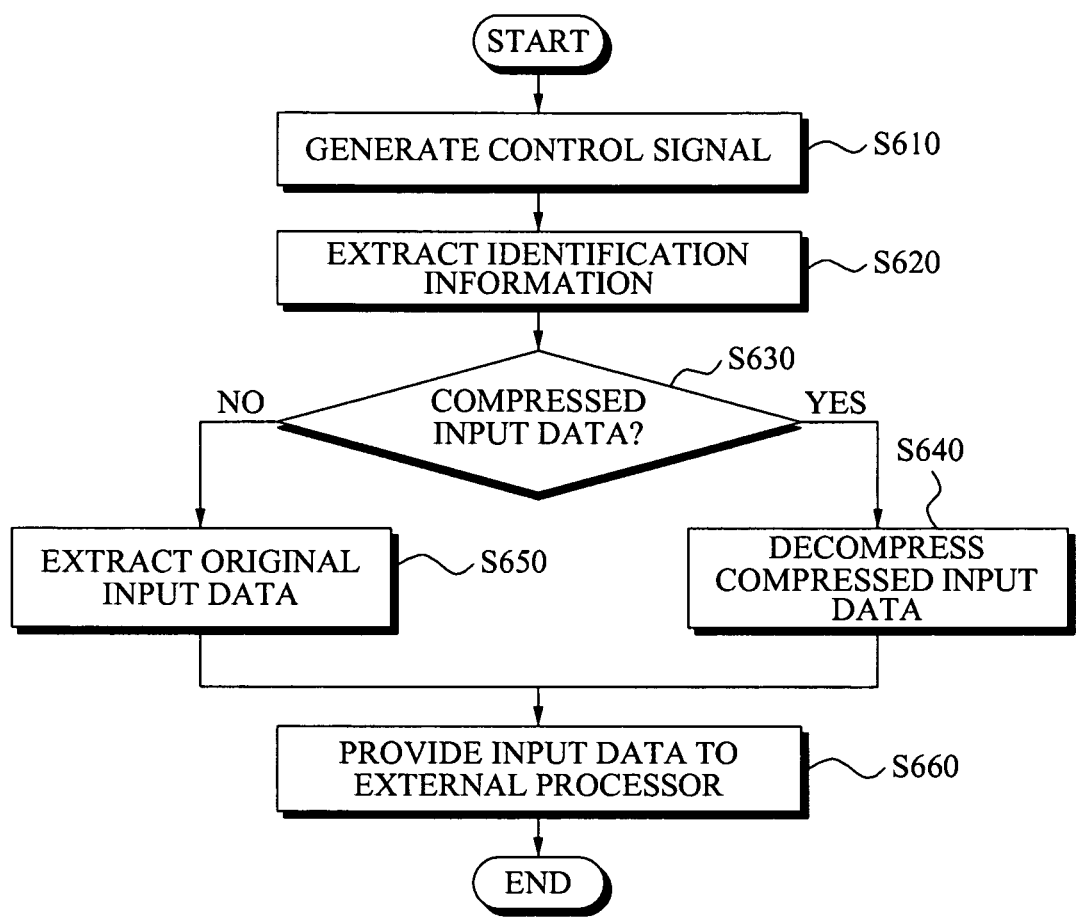
FIG. 6 illustrates a flowchart of a method of operating a flash memory with a compression codec to perform a read operation according to an embodiment.

FIG. 6 illustrates a flowchart of a method of operating a flash memory with a compression codec to perform a read operation according to an embodiment.

The method illustrated in FIG. 6 may correspond to the flash memory control device shown in FIG. 2, which may perform both a write operation and the read operation. Referring again to FIG. 2, the controller circuit 230 may generate a control signal in order to read compressed data that is written in at least one memory block included in the memory array 210. The compression codec circuit 240 may decompress the written compressed data according to a predetermined algorithm.

Here, it is assumed that the compression codec circuit 240 compresses the input data, and the compressed input data and identification information corresponding thereto are written in the memory array 210. In this instance, the controller circuit 230 may generate a control signal in order to read the identification information and the compressed input data.

The compression codec circuit 240 may verify that the compressed input data is compressed by the compression codec circuit 240, based on the read identification information. In this case, the compression codec circuit 240 may restore the input data by decompressing the read compressed input data, and may provide the restored input data to an external processor.

Also, the compression codec circuit 240 may verify that the read input data is not compressed by the compression codec circuit 240, based on the read identification information. In this case, the compression codec circuit 240 may provide the read input data to the external processor as is.

Referring to FIG. 6, in the operating method of the flash memory with the compression codec, a controller circuit may generate a control signal to read input data, or to read compressed input data and identification information that are written in a memory block, in operation S610.

The control signal may be provided to memory cells via an interface circuit. The input data, or the compressed input data and the identification information written in the memory cells may be read according to the control signal.

In operation S620, the operating method of the flash memory may extract the identification information written in the memory cells in response to the control signal.

In operation S630, the operating method of the flash memory may determine whether the written data is original input data or compressed input data, using the identification information.

In operation S650, when the written data is determined as the original input data, the operating method of the flash memory may extract the original input data written in the memory cells. In operation S660, the extracted input data may be provided to an external processor.

Conversely, when the written data is determined as the compressed input data, the operating method of the flash memory may extract the compressed input data written in the memory cells, and decompress the compressed input data in operation S640.

In operation S660, the input data generated through the above decompression process may be provided to the external processor. Here, the external processor may be installed in various types of applications that are applicable to the flash memory.

The flash memory operating method according to the above-described embodiments may be recorded in computer-readable media including program instructions to implement various operations embodied by a computer. The media may also include, alone or in combination with the program instructions, data files, data structures, and the like. Examples of computer-readable media include magnetic media such as hard disks, floppy disks, and magnetic tape; optical media such as CD ROM disks and DVDs; magneto-optical media such as optical disks; and hardware devices that are specially configured to store and perform program instructions, such as read-only memory (ROM), random access memory (RAM), flash memory, etc. Examples of program instructions include both machine code, such as produced by a compiler, and files containing higher level code that may be executed by the computer using an interpreter. The described hardware devices may be configured to act as one or more software modules instructing at least one processing device to perform the operations of the above-described embodiments, or vice versa.

Although a few embodiments have been shown and described, it would be appreciated by those skilled in the art that changes may be made in these embodiments without departing from the principles and spirit of the disclosure, the scope of which is defined by the claims and their equivalents.

What is claimed is:

1. A flash memory integrated circuit with a compression codec, comprising:
   at least one memory block including a plurality of pages;
   a type decision circuit configured to determine whether input data is compressed by comparing a type of the input data with a predetermined compressing type and to provide a logic value corresponding to the determination;
   a compression codec circuit configured to compress the input data according to the provided logic value when the input data is uncompressed and not to compress the input data according to the provided logic value when the input data is compressed and to generate identification information indicating that the input data is the compressed input data; and
   a controller circuit configured to generate a control signal in order to sequentially write the input data when the controller circuit is configured to receive originally compressed input data from the compression codec circuit and a control signal in order to sequentially write the compressed input data and the identification information when the controller circuit is configured to receive the compressed input data and the identification information from the compression codec circuit in at least one page among the plurality of pages,
   wherein the controller circuit is configured to generate the control signal to control voltages to be applied to a word line or a bit line that is connected to the at least one page.

2. The flash memory integrated circuit of claim 1, wherein the input data is multimedia data.

3. The flash memory integrated circuit of claim 1, wherein the at least one memory block is a memory block of a NAND flash memory.

4. A flash memory integrated circuit with a compression codec, comprising:
   at least one memory block including a plurality of pages;
   a controller circuit configured to generate a control signal in order to read written data that is written in at least one page among the plurality of pages,
   wherein the written data is a compressed input data compressed by a compression codec circuit when an input data is an uncompressed input data or originally compressed input data not compressed by the compression codec circuit after by comparing a type of the input data with a predetermined compressing type and is determined by obtaining identification information from the compression codec circuit indicating that the input data is the compressed input data whether the written data is compressed;
   a compression codec circuit configured to decompress the read written data determined as the compressed input data by the control signal including identification information from a controller circuit and to not decompress the read written data determined as originally compressed input data by using a control signal including identification information from the controller circuit,
   wherein the compressed data is written in the at least one page by the compression codec circuit,
   wherein the controller circuit is configured to generate the control signal to control voltages to be applied to a word line or a bit line that is connected to the at least one page.

5. The flash memory integrated circuit of claim 4, wherein:
   identification information capable of identifying the compressed data is further stored in the at least one memory block.

6. A method of operating a flash memory with a compression codec, the method comprising:
- determining, by a type decision circuit, whether input data is compressed by comparing a type of the input data with a predetermined compressing type,
- wherein the type decision circuit provides a logic value corresponding to the determination;
- compressing, by the compression codec circuit, the input data of the flash memory; and
- generating the control signal in order to write the input data when a controller circuit receives originally compressed input data from the compression codec circuit and the control signal in order to write the compressed input data and the identification information when a controller circuit receives the compressed input data and the identification information from the compression codec circuit in at least one page among a plurality of pages that is included in at least one memory block of the flash memory,
- wherein the compression codec circuit is configured to compress the input data according to the provided logic value when the input data is uncompressed, and not compresses the input data according to the provided logic value when the input data is compressed and generate identification information indicating that the input data is the compressed input data,
- wherein the controller circuit is configured to generate the control signal to control voltages to be applied to a word line or a bit line that is connected to the at least one page.

7. A non-transitory computer-readable recording medium storing a program for causing a processor to implement the method of claim 6.

8. A method of operating a flash memory with a compression codec, the method comprising:
- generating a control signal in order to read written data that is written in at least one page among a plurality of pages included in at least one memory block of the flash memory,
- wherein the written data is a compressed input data compressed by the compression codec circuit when an input data is an uncompressed input data or originally compressed input data not compressed by the compression codec circuit after by comparing a type of the input data with a predetermined compressing type and is determined by obtaining identification information from a compression codec circuit indicating that the input data is the compressed input data whether the written data is compressed;
- decompressing, by the compression codec circuit, the read written data determined as the compressed input data by using the control signal including identification information from the controller circuit and to not decompress the read written data determined as originally compressed input data by using the control signal including identification information from the controller circuit,
- wherein the compressed data is written in the at least one page by the compression codec circuit,
- wherein the controller circuit is configured to generate the control signal to control voltages to be applied to a word line or a bit line that is connected to the at least one page.

9. The method of claim 8, wherein:
- identification information capable of identifying the compressed data is further stored in the at least one memory block.

* * * * *